(12) United States Patent
Parker et al.

(10) Patent No.: US 7,586,037 B2
(45) Date of Patent: Sep. 8, 2009

(54) ELECTRICAL APPARATUS CUBICLE WITH REMOVABLE INTERNAL SIDE PANELS

(75) Inventors: Paul Kimball Parker, Wexford, PA (US); James Edward Smith, Pittsburgh, PA (US); Paul Anthony Colbaugh, Allison Park, PA (US); Ronald Alan Carder, Pittsburgh, PA (US); Marcy Dawn Scialabba, Monaca, PA (US)

(73) Assignee: Eaton Corporation, Cleveland, OH (US)

( * ) Notice: Subject to any disclaimer, the term of this patent is extended or adjusted under 35 U.S.C. 154(b) by 271 days.

(21) Appl. No.: 11/537,077

(22) Filed: Sep. 29, 2006

(65) Prior Publication Data

US 2008/0078566 A1    Apr. 3, 2008

(51) Int. Cl.
*H02G 3/08* (2006.01)

(52) U.S. Cl. .................. 174/50; 174/17 R; 174/520; 220/3.2; 220/4.02; 361/679.01; 361/724; 361/752; 312/223.1; 312/223.2

(58) Field of Classification Search ............ 174/50, 174/53, 57, 58, 17 R, 520; 220/3.2–3.9, 220/4.02; 361/600, 601, 641, 657, 679, 679.01, 361/724, 752, 730; 312/223.1, 223.2, 223.3, 312/223.6, 257.1, 265.1, 265.2, 265.6, 265.4; 211/26; 52/220.1, 220.3, 220.5, 220.7
See application file for complete search history.

(56) References Cited

U.S. PATENT DOCUMENTS

| 3,584,136 | A | * | 6/1971 | Robert | 174/53 |
| 5,574,251 | A | * | 11/1996 | Sevier | 174/50 |
| 5,595,316 | A | * | 1/1997 | Gallarelli et al. | 220/3.7 |
| 6,015,195 | A | * | 1/2000 | Anderson et al. | 312/223.2 |
| 6,036,290 | A | * | 3/2000 | Jancsek et al. | 312/265.4 |
| 6,179,398 | B1 | * | 1/2001 | Martin | 312/265.4 |
| 6,359,217 | B1 | * | 3/2002 | Thompson et al. | 174/50 |
| 6,515,225 | B1 | * | 2/2003 | Wright | 174/50 |
| 6,565,166 | B1 | * | 5/2003 | Bulk et al. | 312/223.6 |
| 6,945,616 | B2 | * | 9/2005 | Webster et al. | 312/265.4 |
| 7,381,907 | B1 | * | 6/2008 | Frusco | 174/50 |

* cited by examiner

*Primary Examiner*—Angel R Estrada
(74) *Attorney, Agent, or Firm*—Martin J. Moran

(57) ABSTRACT

On embodiment of the disclosed invention provides an electrical equipment cubicle having at least one removable side panel. The removable side panel is not fixed to the electrical equipment cubicle. Instead, the removable side panel is removably coupled to the frame assembly by an easily separable coupling device such as, but not limited to, a tab-and-receptacle device and/or easily accessible fasteners.

17 Claims, 3 Drawing Sheets

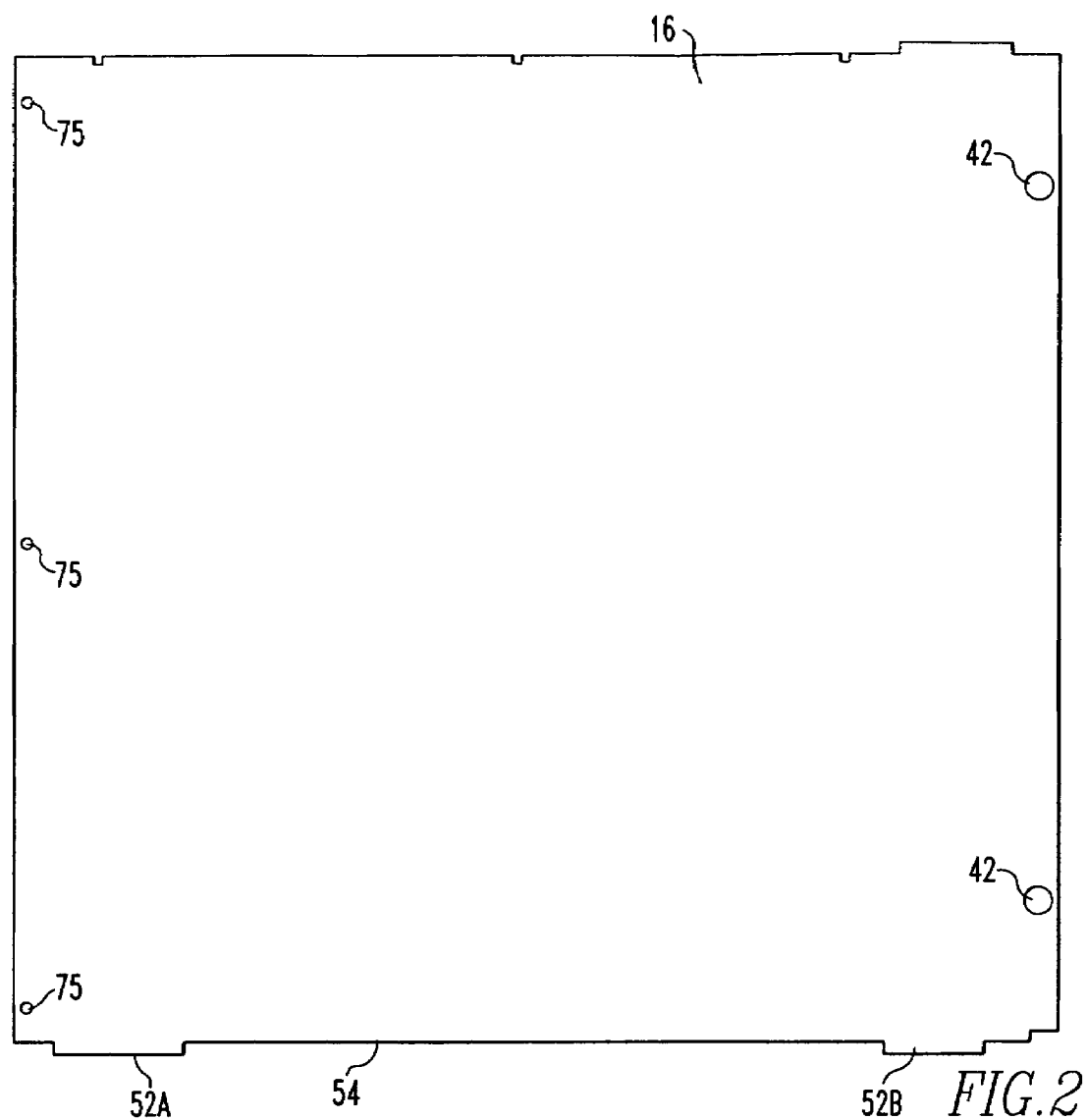
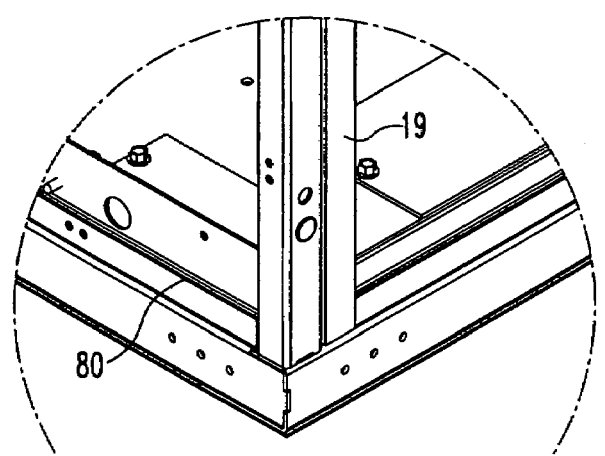
FIG.2
FIG.3A

US 7,586,037 B2

ELECTRICAL APPARATUS CUBICLE WITH REMOVABLE INTERNAL SIDE PANELS

BACKGROUND OF THE INVENTION

1. Field of the Invention

The present invention relates to an electrical apparatus cubicle and, more specifically to an electrical apparatus cubicle having removable sides.

2. Background Information

Various electrical system components, such as, but not limited to, circuit breakers, network protectors, and switchgears, are disposed in enclosed structures commonly called "cubicles." A cubicle is structured to endure and is typically very sturdy. Such cubicles, typically, have a rectangular hexahedron, or box-shaped frame assembly, a pivoting front door and fixed side panels. The frame assembly, door and side panels define an enclosed space into which one or more electrical system components are placed. Each cubicle is, typically, just large enough to enclose the electrical system components. Such cubicles are commonly coupled together in a matrix, e.g. stacked, disposed side by side, or both. This configuration, however, has disadvantages.

Various sub-components of the electrical system components or elements of the cubicle are disposed along the sides and the back of the cubicle. Such components are difficult to access when the electrical system components are disposed within the cubicle. As such, the electrical system components must be removed from the cubicle for maintenance and repair procedures. Such removal procedures are time consuming, costly, and if proper safety procedures are not followed, dangerous. Therefore, it would be advantageous to provide a cubicle structured to allow a user to access the typically inaccessible areas of a cubicle while the electronic components remain in the cubicle.

There is, therefore, a need for an electrical equipment cubicle having at least one removable side panel.

There is a further need for a plurality of electrical equipment cubicles, each having at least one removable side panel, so that a technician may access one cubicle through an adjacent cubicle.

SUMMARY OF THE INVENTION

These needs and others are met by at least one embodiment of the disclosed invention which provides an electrical equipment cubicle having at least one removable side panel. The removable side panel is not fixed to the electrical equipment cubicle. Instead, the removable side panel is removably coupled to an outer frame assembly by an easily separable coupling device such as, but not limited to, a tab-and-receptacle and/or easily accessible fasteners. The side panel may be removed from the cubicle so that the interior space of the cubicle may be accessed via the open side. When cubicles are disposed in a matrix, e.g., side by side, and adjacent side panels on separate cubicles are removed, one cubicle may be used to access the adjacent cubicle.

BRIEF DESCRIPTION OF THE DRAWINGS

A full understanding of the invention can be gained from the following description of the preferred embodiments when read in conjunction with the accompanying drawings in which:

FIG. 2 is a plan view of a removable side panel.

DESCRIPTION OF THE PREFERRED EMBODIMENTS

As used herein, "coupled" means a link between two or more elements, whether direct or indirect, so long as a link occurs.

As used herein, "attached" means that two elements are directly in contact with each other.

As used herein "fixed" means that two or more elements are coupled together so that the elements cannot be separated easily. For example, two elements welded together or held together by a fastener that cannot be easily accessed are "fixed" together. Conversely, two elements held together by an exposed, or easily exposed, fastener are not "fixed" together.

As used herein a "side panel" substantially covers the entire side of a frame assembly as opposed to an "access panel" which is smaller than the entire side of a frame assembly. A "side panel" may have an "access panel," or other types of openings thereon.

As used herein a "reusable coupling device" is a non-destructive coupling device such as, but not limited to, a bolt and nut. A coupling device such as a sheet metal screw is a destructive coupling device as such a device damages the material through which it is placed.

Figure 1:
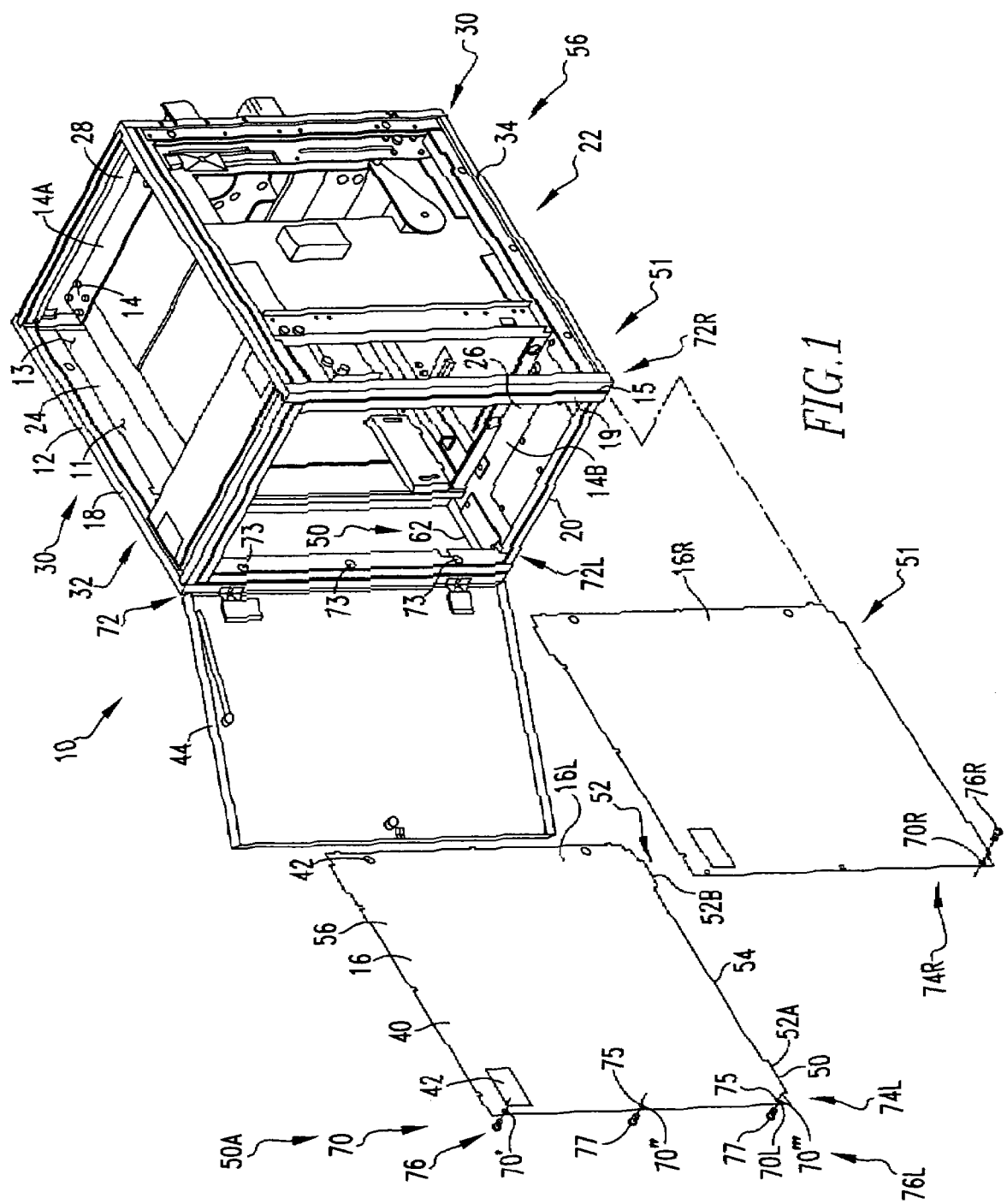
FIG. 1 is an exploded isometric view of a cubicle.

As shown in FIG. 1, a cubical 10 for electrical equipment is structured to enclose various components of an electrical system such as, but not limited to, circuit breakers, network protectors, and switchgears (not shown). The cubicle 10 includes an outer frame assembly 12, an inner frame assembly 17, at least one fixed side panel 14, and at least one removable side panel 16. The outer frame assembly 12 includes a plurality of generally straight, rigid members 18. The outer frame assembly members 18 are structured to form a generally rectangular hexahedron, that is, a three-dimensional rectangular framework. The outer frame assembly 12 has a primary, front side 20 and a plurality of secondary sides 22. All of the outer frame assembly sides 20, 22 are generally planar. The plurality of secondary sides 22 includes a top side 24, a bottom side 26, a back side 28, and two lateral sides 30. The lateral sides 30 may be further identified as a first, left lateral side 32 and a second, right lateral side 34. The inner frame assembly 17 also includes a plurality of generally straight, rigid members 19. The inner frame assembly 17 is slightly smaller than the outer frame assembly 12. As such, a gap 15 exists between the inner frame assembly 17 and the outer frame assembly 12. The inner frame assembly 17 and the outer frame assembly 12 are, preferably coupled to a fixed bottom side panel 14B.

A removable side panel 16 has a generally planar body 40 having a generally rectangular shape. The side panel body 40 may have one or more openings 42 therein. Each side panel body 40 is sized to cover substantially all of an associated side of the frame assembly 12. In the preferred embodiment, a door panel 44 is pivotally coupled to the frame assembly 12 and extends over the front side 20. The door panel 44 may be a removable side panel 16. Additionally, in the preferred embodiment, the side panel 16 extending over the back side 28 is a fixed side panel 14A. The back side fixed panel 14A, typically, has a number of openings therein (not shown) structured to allow a bus assembly, or a similar structure, to extend therethrough.

Each of the remaining secondary sides 22, that is, the top side 24, the bottom side 26, the first, left lateral side 32 and the second, right lateral side 34, may have a removable side panel 16 disposed thereon. Each removable side panel 16 is coupled to the frame assembly 12 by one or more reusable coupling devices 50. The first embodiment of the coupling device 50 is a tab and receptacle coupling device 51. However, other embodiments of the coupling device 50 may also be, or further include, but are not limited to, easily accessible fastener locations, a tongue and groove construction or a tab-and-receptacle construction. (discussed below). The coupling device 50 for each removable side panel 16 is, preferably, the same type of device. As such, the following description shall address a single removable side panel 16. It is understood, however, that the same or substantially similar coupling device(s) 50 may be associated with any of the remaining secondary sides 22.

As shown in FIG. 1, the first, left lateral side 32 has a removable side panel 16 disposed thereon. The removable side panel 16 is disposed within the gap 15 located between the inner frame assembly 17 and the outer frame assembly 12. Preferably, the gap 15 is slightly wider than the thickness of the removable side panel 16. Thus, the inner frame assembly 17 and the outer frame assembly 12 both support and guide the removable side panel 16 as the removable side panel 16 is moved into, and out of, position. The removable side panel 16 is coupled to the frame assembly 12 by a tab-and-receptacle coupling device 51. That is, the coupling device 50 includes at least one extension, or tab 52, extending from a lower edge 54 of the side panel body 40. The at least one tab 52 is disposed in the plane of the side panel body 40. The frame assembly 12 includes at least one receptacle 56 for the at least one tab 52. The at least one receptacle 56 may be a clip (not shown) structured to engage the at least one tab 52. However, in the preferred embodiment, the at least one receptacle 56 is a slot 62 in the frame assembly 12. The at least one slot 62 is positioned to engage the at least one tab 52 when the removable side panel 16 is disposed over the associated secondary side 22 of the frame assembly 12. Preferably, the at least one tab 52 includes two tabs 52A, 52B disposed on the lower edge 54 of the side panel body 40. The frame assembly 12 at least one receptacle 56 includes two slots 62 (one shown) on the frame assembly member 18 disposed along the vertex of the bottom side 26 and the first, left lateral side 32.

In this configuration, the removable side panel 16 is coupled to the frame assembly 12 and, along with the other fixed and removable side panels 14, 16, defines an enclosed space 11 in which electronic equipment (not shown) may be disposed. When electronic equipment is disposed in the enclosed space 11, certain portions, hereinafter "blocked portions" 13, of the enclosed space 11, such as the portion adjacent to the back side 28 may be difficult to access via the door panel 44. To access the blocked portions 13 of the enclosed space 11 a user simply lifts the removable side panel 16 disposed over the first, left lateral side 32 until the tabs 52A, 52B are no longer disposed within the slots 62 and removes the removable side panel 16. Installation of the removable side panel 16 is the reverse of removal. Because the coupling device 50 is reusable, the removable side panel 16 may be removed and installed repeatedly without damaging the frame assembly 12.

The removable side panel 16 may be attached to the frame assembly 12 by more than one coupling device 50. For example, a second embodiment of a coupling device 50A may also be at least one easily accessed fastener location 70. Each fastener location 70 includes three components; a first, frame component 72, a second, side panel component 74 and a linking component 76. For example, if a fastener location frame component 72 is an opening 73, the fastener location side panel component 74 is a fastener opening 75, and the fastener location linking component 76 is a nut and bolt device 77. Additionally, the fastener location 70 may be any number of fastening devices such as, but not limited to, threaded rod/opening/nut device, a hasp/staple/pin device or a hinge/pin device. As shown in FIG. 1, the at least one fastener location 70 includes three fastener locations 70', 70'', 70''' disposed along the front edge of the first, left lateral side 32. Each fastener location 70', 70'', 70''' has an opening 73 disposed on the frame assembly 12, a fastener opening 75 on the removable side panel 16, and a nut and bolt device 77. The three fastener locations 70', 70'', 70''' are disposed adjacent to the vertex of the front side 20 and the first, left lateral side 32. In these locations a user may easily access each fastener location 70', 70'', 70''' by opening the door panel 44. That is, an easily accessed fastener location 70 is not located within the blocked portion 13 of the enclosed space 11. The frame assembly openings 73 and the side panel fastener openings 75 are structured to be aligned when the removable side panel 16 is disposed over the first, left lateral side 32. When the frame assembly openings 73 and the side panel fastener openings 75 are aligned, a user may insert a nut and bolt device 77 therethrough. As such, a user may install/remove the nut and bolt device 77 without having to reach into the blocked portion 13 of the enclosed space 11. Further, the removable side panel 16 may be coupled to the frame assembly 12 by at least one fastener location without the use of a tab and receptacle.

The second embodiment of the coupling device 50A may also be used on more than one side of the frame assembly 12. For example, a cubicle 10 having removable panels 16L, 16R disposed over the first, left lateral side 32 and the second, right lateral side 34 would have at least one left side fastener location 70L and at least one right side fastener location 70R. Thus, the frame assembly 12 has at least one left side first component 72L disposed adjacent to the vertex of the front side 20 and said first, left lateral side 32 as well as a first removable side panel 16L having at least one second component 74L structured to engage the at least one left side first component 72L. The at least one left side fastener location 70L is structured to couple the first removable side panel 16L to the first, left lateral side 32 of the frame assembly 12 by utilizing a left side linking component 76L. Similarly, the frame assembly 12 also has at least one right side first component 72R disposed adjacent to the vertex of the front side 20 and the second, right lateral side 34. The second removable side panel 16R has at least one second component 74R structured to engage the at least one right side first component 72R. The at least one right side fastener location 70R is structured to couple the second removable side panel 16R to the frame assembly 12 second, right lateral side 34 utilizing a right side linking component 76R.

A third embodiment of a coupling device 50B may be a tongue-and-groove structure. That is, the frame assembly 12 includes at least one groove 80, and preferably two grooves 80, extending along parallel verticies of the secondary sides 22 having removable side panels 16. For example, if the first, left lateral side 32 of the frame assembly 12 is covered by a removable side panel 16, the frame assembly 12 has grooves 80 extending along the vertex between the top side 24 and first, left lateral side 32, as well as a corresponding groove 80 extending along the vertex of the bottom side 26 and first, left lateral side 32. The removable side panel body 40 has a lower edge 54 and a top edge 55. The side panel edges 54, 55 act as the tongue portion of the coupling device 50B. In this configuration, the removable side panel 16 simply slides between an installed position and a removed position. As before, this coupling device 50B may be combined with one or more other embodiments of the coupling device 50, 50A disclosed above.

Figures 3, 3A:
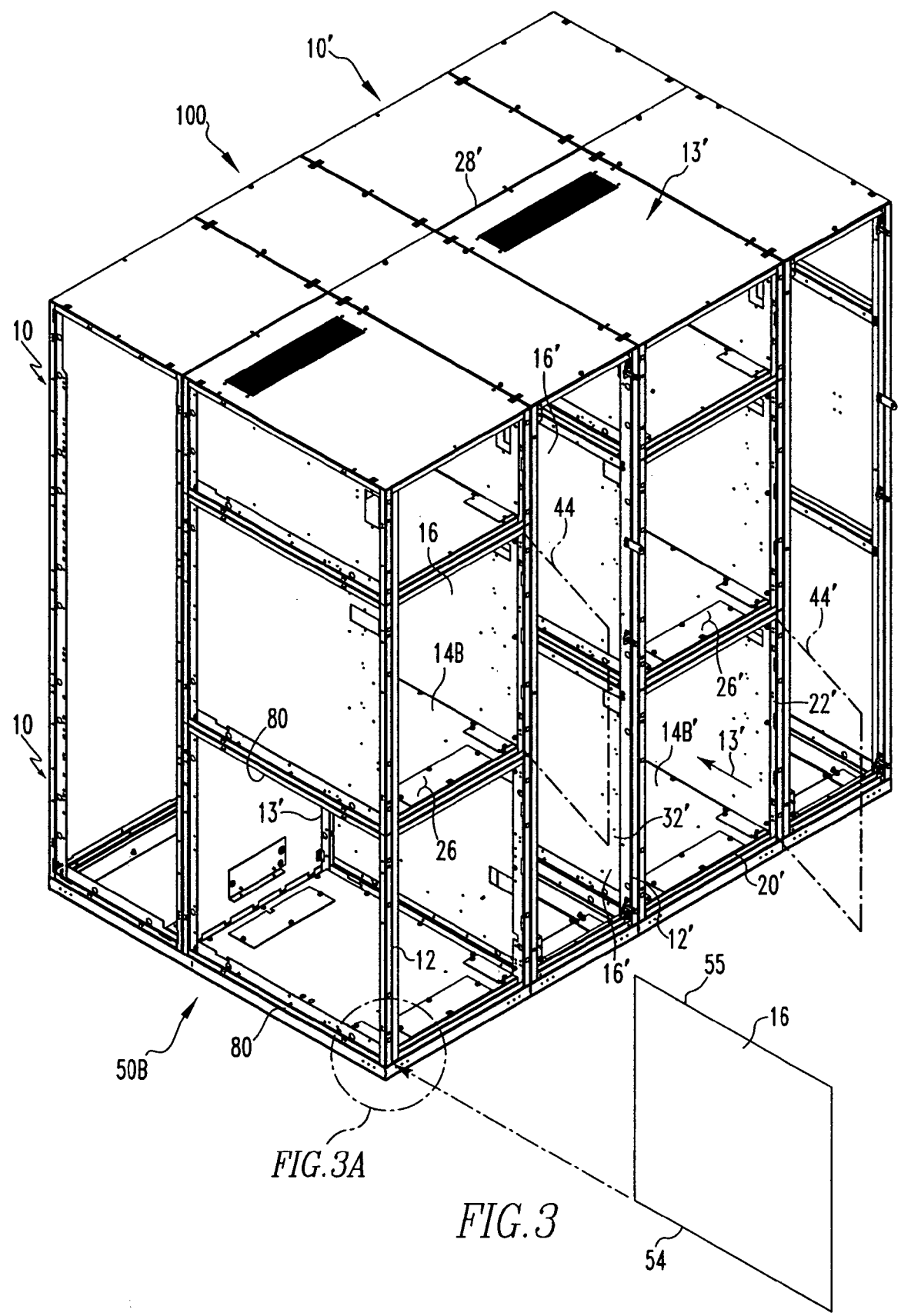
FIG. 3 an isometric view of a cubicle matrix.
FIG. 3A is a detail view of the cubicle matrix.

The cubicle 10 is useful when multiple cubicles 10 are disposed in a matrix 100. A matrix 100 has two or more cubicles 10, 10' disposed immediately adjacent to each other, either side by side, stacked, or both. As shown in FIG. 3, a matrix 100 has a first cubicle 10 and a second cubicle 10' which are disposed side by side, with the second cubicle 10' being to the right of the first cubicle 10. As described above, each cubicle 10, 10' has a door panel 44, 44' pivotally coupled to each respective front side 20, 20'. A fixed side panel 14B, 14B' is coupled to each respective bottom side 26, 26'. While any of the remaining secondary sides 22, 22' may have a removable panel 16 coupled thereto, for the sake of this example the first cubicle 10 has a removable panel 16 coupled to frame assembly 12 over the second, right lateral side 34. The second cubicle 10' has a removable panel 16' coupled to the frame assembly 12' over the first, left lateral side 32'. Further, assume that the electronic components have been removed from the first cubicle 10. To access the blocked portion 13' of the second cubicle 10', a user would only have to remove the removable panel 16 from the second, right lateral side 34 of the first cubicle 10, and the removable panel 16' from the first, left lateral side 32' of the second cubicle 10'. The user could then reach through the first cubicle 10 into the blocked portion 13' of the second cubicle 10'.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A cubicle for electrical equipment comprising:
   a frame assembly defining a generally rectangular hexahedron with an interior space, said frame assembly having a primary, front side, and a plurality of secondary sides, said secondary sides including a top side, a bottom side, a back side, and two lateral sides;
   at least one removable side panel removably coupled to frame assembly and disposed over at least one of said secondary sides;
   at least one reusable coupling device structured to removably couple said at least one removable side panel to said frame assembly;
   at least one fixed side panel, each said fixed side panel coupled to frame assembly and disposed over any of said secondary sides not covered by a removable side panel;
   said least one removable side panel and said least one fixed side panel defines an enclosed space;
   wherein, when said electrical equipment is disposed within said enclosed space, said enclosed space includes blocked portions; and
   wherein removal of said at least one removable side panel allows access to said blocked portions of said enclosed space.

2. The cubicle of claim 1 wherein:
   said at least one reusable coupling device includes at least one tab and at least one receptacle;
   said frame assembly includes said at least one receptacle disposed along at least one of said secondary sides;
   said at least one removable side panel includes said tab, said tab sized to engage said at least one receptacle; and
   whereby said at least one removable side panel is coupled to said frame assembly by having said at least one tab disposed in said at least one receptacle.

3. The cubicle of claim 2 wherein said receptacle is a clip.

4. The cubicle of claim 2 wherein said receptacle is a slot.

5. The cubicle of claim 2 wherein:
   said frame assembly includes a door panel;
   at least one fixed side panel fixed to said frame assembly back side;
   said door panel pivotally coupled to said frame assembly front side;
   said at least one reusable coupling device includes a second coupling device having at least one fastener location, said fastener location having a first component disposed on said frame assembly and a second component disposed on said at least one removable side panel, and a linking component;
   said frame assembly having at least one first component disposed adjacent to the vertex of said front side and said at least one removable side panel;
   said at least one removable side panel having at least one second component structured to be aligned with said at least one first component; and
   wherein said at least one removable side panel is removably coupled to said frame assembly by said linking component extending through said first and second fastener location components.

6. The cubicle of claim 2 wherein:
   said lateral sides includes a first, left lateral side and a second, right lateral side;
   said at least one removable side panel includes a first removable side panel and a second removable side panel;
   said first removable side panel disposed over said first, left lateral side; and
   said second removable side panel disposed over said second, right lateral side.

7. The cubicle of claim 6 wherein:
   said frame assembly includes a door panel;
   at least one fixed side panel fixed to each of said frame assembly back side, top side and bottom side;
   said door panel pivotally coupled to said frame assembly front side;
   said at least one reusable coupling device includes a second coupling device having at least one fastener location, said fastener location having a first component disposed on said frame assembly and a second component disposed on said at least one removable side panel, and a linking component;
   said frame assembly having at least one left side first component disposed adjacent to the vertex of said front side and said first, left lateral side;
   said first removable side panel having at least one second component structured to engage said at least one left side first component;
   wherein said at least one left side fastener location is structured to couple said first removable side panel to said frame assembly first, left lateral side;
   said frame assembly having at least one right side first component disposed adjacent to the vertex of said front side and said second, right lateral side; and
   said second removable side panel having at least one second component structured to engage said at least one right side first component; and
   wherein said at least one right side fastener location is structured to couple said second removable side panel to said frame assembly second, right lateral side.

8. The cubicle of claim 1 wherein:
   said frame assembly includes a door panel;
   at least one fixed side panel fixed to said frame assembly back side;

said door panel pivotally coupled to said frame assembly front side;
said at least one reusable coupling device has at least one fastener location, said fastener location having a first component disposed on said frame assembly and a second component disposed on said at least one removable side panel, and a linking component;
said frame assembly having at least one first component disposed adjacent to the vertex of said front side and said at least one removable side panel;
said at least one removable side panel having at least one second component structured to be aligned with said at least one first component;
wherein said at least one removable side panel is removably coupled to said frame assembly by said linking component extending through said first and second fastener location components.

9. The cubicle of claim 8 wherein:
said at least one reusable coupling device includes at least one groove on said frame assembly and a tongue on said removable side panel;
said groove extending along the vertex of said top side and at least one of said two lateral sides; and
said at least one removable side panel having a generally flat body, said body having an upper edge, said upper edge being said tongue.

10. The cubicle of claim 9 wherein:
said lateral sides includes a first, left lateral side and a second, right lateral side;
said at least one removable side panel includes a first removable side panel and a second removable side panel;
said first removable side panel disposed over said first, left lateral side;
said second removable side panel disposed over said second, right lateral side;
said at least one reusable coupling device having groove extending along the vertex of said top side and first, left lateral side; and
said at least one reusable coupling device having a groove extending along the vertex of said top side and second, right lateral side.

11. The cubicle of claim 1 wherein:
said at least one reusable coupling device includes at least one groove on said frame assembly and a tongue on said removable side panel;
said groove extending along the vertex of said top side and at least one of said two lateral sides; and
said at least one removable side panel having a generally flat body, said body having an upper edge, said upper edge being said tongue.

12. The cubicle of claim 11 wherein:
said lateral sides includes a first, left lateral side and a second, right lateral side;
said at least one removable side panel includes a first removable side panel and a second removable side panel;
said first removable side panel disposed over said first, left lateral side;
said second removable side panel disposed over said second, right lateral side;
said at least one reusable coupling device having a groove extending along the vertex of said top side and first, left lateral side; and
said at least one reusable coupling device having groove extending along the vertex of said top side and second, right lateral side.

13. A cubicle matrix comprising:
a first cubicle and a second cubicle;
said first cubicle having a frame assembly defining a generally rectangular hexahedron with an interior space, said first cubicle frame assembly having a primary, front side, and a plurality of secondary sides, said secondary sides including a top side, a bottom side, a back side, and two lateral sides;
at least one removable side panel removably coupled to first cubicle frame assembly and disposed over at least one of said first cubicle secondary sides;
at least one first reusable coupling device structured to removably couple said first cubicle at least one removable side panel to said first cubicle frame assembly;
at least one fixed side panel, each said fixed side panel coupled to first cubicle frame assembly and disposed over any of said secondary sides not covered by a removable side panel;
said least one removable side panel and said least one fixed side panel defines a first cubicle enclosed space;
wherein, when said electrical equipment is disposed within said first cubicle enclosed space, said first cubicle enclosed space includes blocked portions;
wherein removal of said least one removable side panel allows access to said blocked portions of said first cubicle first cubicle enclosed space;
said second cubicle having a frame assembly defining a generally rectangular hexahedron with an interior space, said second cubicle frame assembly having a primary, front side, and a plurality of secondary sides, said secondary sides including a top side, a bottom side, a back side, and two lateral sides;
at least one removable side panel removably coupled to second cubicle frame assembly and disposed over at least one of said second cubicle secondary sides;
at least one second reusable coupling device structured to removably couple said second cubicle at least one removable side panel to said second cubicle frame assembly;
at least one fixed side panel, each said fixed side panel coupled to second cubicle frame assembly and disposed over any of said secondary sides not covered by a removable side panel;
said least one removable side panel and said least one fixed side panel defines a second cubicle enclosed space;
wherein, when said electrical equipment is disposed within said second cubicle enclosed space, said second cubicle enclosed space includes blocked portions; and
wherein removal of said least one removable side panel allows access to said blocked portions of said second cubicle enclosed space.

14. The cubicle matrix of claim 13 wherein:
said at least one first reusable coupling device includes at least one tab and at least one receptacle;
said first cubicle frame assembly includes said at least one receptacle disposed along at least one of said first cubicle secondary sides;
said at least one removable first cubicle side panel includes said tab, said tab sized to engage said at least one receptacle; and
whereby said at least one removable first cubicle side panel is coupled to said first cubicle frame assembly by having said at least one tab disposed in said at least one receptacle.

15. The cubicle matrix of claim 14 wherein said receptacle is a clip.

16. The cubicle matrix of claim 14 wherein said receptacle is a slot.

17. The cubicle matrix of claim 13 wherein:
said first cubicle at least one removable side panel is disposed adjacent to said second cubicle at least one removable side panel; and
said second cubicle at least one removable side panel is disposed adjacent to said first cubicle at least one removable side panel.

\* \* \* \* \*